United States Patent
Ma

(10) Patent No.: US 11,501,949 B2
(45) Date of Patent: Nov. 15, 2022

(54) WAFER INSPECTION BASED ON ELECTRON BEAM INDUCED CURRENT

(71) Applicant: ASML Netherlands B.V., Veldhoven (NL)

(72) Inventor: Long Ma, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 17/251,770

(22) PCT Filed: May 23, 2019

(86) PCT No.: PCT/EP2019/063286
§ 371 (c)(1),
(2) Date: Dec. 11, 2020

(87) PCT Pub. No.: WO2019/238373
PCT Pub. Date: Dec. 19, 2019

(65) Prior Publication Data
US 2021/0134556 A1     May 6, 2021

Related U.S. Application Data

(60) Provisional application No. 62/684,141, filed on Jun. 12, 2018.

(51) Int. Cl.
*H01J 37/22*     (2006.01)
*H01J 37/244*    (2006.01)
*H01J 37/28*     (2006.01)

(52) U.S. Cl.
CPC ........ *H01J 37/222* (2013.01); *H01J 37/244* (2013.01); *H01J 37/28* (2013.01);
(Continued)

(58) Field of Classification Search
CPC ........ H01J 37/222; H01J 37/244; H01J 37/28; H01J 2237/226; H01J 2237/24475;
(Continued)

(56) References Cited

U.S. PATENT DOCUMENTS

| 6,232,787 B1 * | 5/2001 | Lo ......................... H01J 37/268 250/311 |
| 6,323,484 B1 * | 11/2001 | Ide ......................... H01J 37/252 250/307 |

(Continued)

FOREIGN PATENT DOCUMENTS

| CN | 103165582 A | 6/2013 |
| EP | 1 511 066 A2 | 3/2005 |

(Continued)

OTHER PUBLICATIONS

International Search Report and Written Opinion issued by the International Searching Authority in related International Application No. PCT/EP2019/063286, dated Sep. 4, 2019 (12 pgs.).

(Continued)

*Primary Examiner* — David A Vanore
(74) *Attorney, Agent, or Firm* — Finnegan, Henderson, Farabow, Garrett & Dunner, LLP

(57) ABSTRACT

A wafer inspection system is disclosed. According to certain embodiments, the system includes an electron detector that includes circuitry to detect secondary electrons or backscattered electrons (SE/BSE) emitted from a wafer. The electron beam system also includes a current detector that includes circuitry to detect an electron-beam-induced current (EBIC) from the wafer. The electron beam system further includes a controller having one or more processors and a memory, the controller including circuitry to: acquire data regarding the SE/BSE; acquire data regarding the EBIC; and deter-
(Continued)

mine structural information of the wafer based on an evaluation of the SE/BSE data and the EBIC data.

16 Claims, 7 Drawing Sheets

(52) U.S. Cl.
CPC . *H01J 2237/226* (2013.01); *H01J 2237/2448* (2013.01); *H01J 2237/24475* (2013.01); *H01J 2237/24564* (2013.01); *H01J 2237/2813* (2013.01)

(58) Field of Classification Search
CPC ..... H01J 2237/2448; H01J 2237/24564; H01J 2237/2813; H01J 2237/24592; H01J 2237/2803; H01J 2237/281; H01J 2237/2815; H01J 2237/2817
See application file for complete search history.

(56) References Cited

U.S. PATENT DOCUMENTS

| | | | | |
|---|---|---|---|---|
| 6,559,662 | B1* | 5/2003 | Yamada | G01R 31/311 850/10 |
| 6,946,857 | B2* | 9/2005 | Yamada | H01J 37/256 324/762.05 |
| 7,002,361 | B2* | 2/2006 | Yamada | G01B 15/02 324/702 |
| 7,049,834 | B2* | 5/2006 | Yamada | G01R 31/307 324/762.05 |
| 7,368,713 | B2* | 5/2008 | Matsui | H01J 37/28 250/397 |
| 7,385,195 | B2* | 6/2008 | Yamada | G01R 31/307 250/307 |
| 7,425,714 | B2* | 9/2008 | Sakakibara | H01J 37/243 250/397 |
| 7,602,197 | B2* | 10/2009 | Kadyshevitch | G01R 31/307 324/501 |
| 7,663,104 | B2* | 2/2010 | Obuki | G01N 23/225 250/311 |
| 9,529,041 | B2* | 12/2016 | Erickson | G01R 31/307 |
| 10,933,490 | B2* | 3/2021 | Softer | H05K 3/0038 |
| 2004/0084622 | A1* | 5/2004 | Kadyshevitch | H01J 37/32935 250/307 |
| 2004/0239347 | A1 | 12/2004 | Yamada et al. | |
| 2005/0151456 | A1* | 7/2005 | Yoon | H01J 1/3042 313/309 |
| 2005/0279935 | A1* | 12/2005 | Shur | G01N 23/225 250/307 |
| 2006/0038137 | A1* | 2/2006 | Fujii | H01J 37/3056 250/492.2 |
| 2006/0054813 | A1 | 3/2006 | Nokuo et al. | |
| 2008/0011948 | A1 | 1/2008 | Davilla et al. | |
| 2008/0135754 | A1 | 6/2008 | Eto | |
| 2011/0278452 | A1* | 11/2011 | Nozoe | H01L 22/12 250/311 |

FOREIGN PATENT DOCUMENTS

| | | |
|---|---|---|
| EP | 1511066 | 3/2005 |
| JP | 2002-083849 A | 3/2002 |
| JP | 2003 303867 A | 10/2003 |
| JP | 2003-303867 A | 10/2003 |
| JP | 2005-071775 A | 3/2005 |
| JP | 2006-119133 A | 5/2006 |
| JP | 2008-166702 A | 7/2008 |
| TW | 473892 B | 1/2002 |
| TW | 201810343 A | 3/2018 |

OTHER PUBLICATIONS

Office Action issued by the Chinese Intellectual Patent Office (IPO) in related ROC (Taiwan) Patent Application No. 108119262, dated Mar. 3, 2020 (10 pgs.).

Notice of Reasons for Rejection, issued by Japanese Patent Office, corresponding with Japanese Application No. JP 2020-566704, dated Feb. 7, 2022. (7 pages).

Notice of Reasons for Rejection from the Japan Patent Office issued in related Japanese Patent Application No. 2020-566704; dated Jun. 15, 2022 (7 pgs.).

Notification of Reason(s) for Refusal issued by the Korean Patent Office in related Korean Patent Application No. 10-2020-7035803; dated Aug. 10, 2022 (11 pgs.).

* cited by examiner

WAFER INSPECTION BASED ON ELECTRON BEAM INDUCED CURRENT

CROSS-REFERENCE TO RELATED APPLICATIONS

This application claims priority to International Application No. PCT/EP2019/063286, filed May 23, 2019, and published as WO 2019/238373 A1, which claims priority of U.S. application 62/684,141 which was filed on Jun. 12, 2018. The contents of these applications are incorporated herein by reference in their entireties.

TECHNICAL FIELD

The present disclosure generally relates to the field of semiconductor wafer metrology, and more particularly, to a system and method for inspecting a wafer by coupling secondary-electron/backscattered-electron (SE/BSE) imaging of the wafer with electron-beam-induced-current (EBIC) imaging of wafer.

BACKGROUND

In manufacturing processes of integrated circuits (ICs), unfinished or finished circuit components need to be inspected to ensure that they are manufactured according to design and are free of defects. Moreover, before being used to fabricate the ICs, an un-patterned or bare wafer also needs to be inspected to ensure it is free of defects or meets the required specifications. As such, a wafer inspection process has been integrated into the manufacturing process. Specifically, a wafer inspection system may employ optical microscopies or a charged particle (e.g., electron) beam microscopes, such as a scanning electron microscope (SEM), to scan a wafer and construct an image of the wafer surface. The wafer inspection system may then examine the image to detect defects and determine their position coordinates on the wafer.

Compared to a photon beam, an electron beam has a shorter wavelength and thereby may offer superior spatial resolution. Typically, an SEM may focus electrons of a primary electron beam at predetermined scan locations of a wafer under inspection. The primary electron beam interacts with the wafer and may be backscattered or may cause the wafer to emit secondary electrons. The intensity of the backscattered or secondary electrons may vary based on the properties of the internal or external structures of the wafer, and thus indicates structural information of the wafer, such as defects on the wafer, dimensions of certain features, etc.

SUMMARY

Embodiments of the present disclosure relate to a system for inspecting a wafer by coupling secondary-electron/backscattered-electron (SE/BSE) imaging of the wafer with electron-beam-induced-current (EBIC) imaging of the wafer. In some embodiments, an electron beam system is provided. The electron beam system includes an electron detector that includes circuitry to detect SE/BSE emitted from a wafer. The electron beam system also includes a current detector that includes circuitry to detect an EBIC from the wafer. The electron beam system further includes a controller having one or more processors and a memory, the controller including circuitry to: acquire data regarding the SE/BSE; acquire data regarding the EBIC; and determine structural information of the wafer based on an evaluation of the SE/BSE data and the EBIC data.

In some embodiments, a computer system is provided. The computer system includes a memory storing instructions. The computer system also includes a processor electronically coupled to the memory. The processor includes circuitry to execute the instructions to cause the computer system to: acquire data regarding secondary electrons or backscattered electrons (SE/BSE) emitted from a wafer; acquire data regarding an electron-beam-induced current (EBIC) from the wafer; evaluate the SE/BSE data and the EBIC data; and determine structural information of the wafer based on the evaluation of the SE/BSE data and the EBIC data.

In some embodiments, a method is provided. The method includes: acquiring data regarding secondary electrons or backscattered electrons (SE/BSE) emitted from a wafer scanned with an electron beam; acquiring data regarding an electron-beam-induced current (EBIC) from the wafer; and determining structural information of the wafer based on an evaluation of the SE/BSE data and the EBIC data.

In some embodiments, a non-transitory computer-readable medium is provided. The medium stores a set of instructions that is executable by one or more processors of one or more devices to cause the one or more devices to perform a method including: acquiring data regarding secondary electrons or backscattered electrons (SE/BSE) emitted from a wafer; acquiring data regarding an electron-beam-induced current (EBIC) from the wafer; and determining structural information of the wafer based on an evaluation of the SE/BSE data and the EBIC data.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Figure 1:
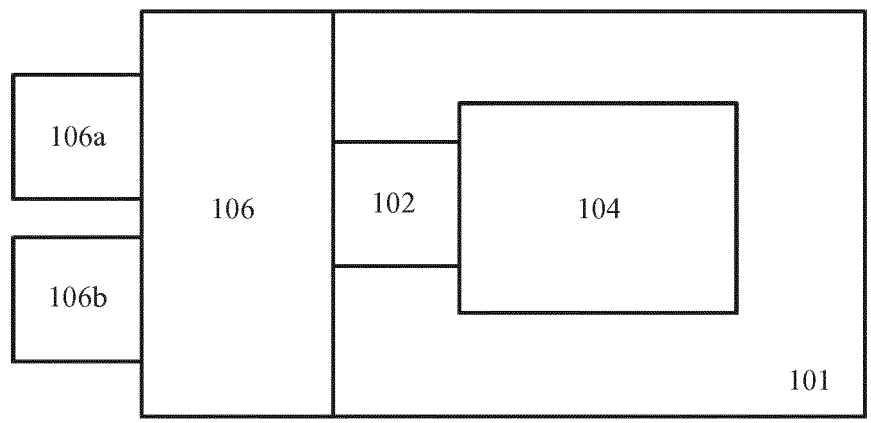
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

As described above, typical electron-beam (ebeam) tools (e.g., SEM) rely on backscattered or secondary electrons to detect structure information of a wafer. However, often in practice the wafer is made from material that can only emit few backscattered or secondary electrons. Moreover, the wafer may be patterned with structures that impair the wafer's ability to emit the backscattered or secondary electrons. In these situations, the backscattered/secondary-electron signal may be too weak to reveal information of any fine structures. Although spending more time in scanning the wafer may increase the amount of collected backscattered/secondary electrons, this will deteriorate the throughput of the ebeam tools.

The present application provides an ebeam system for detecting wafer structure based on an electron signal other than, or in addition to, the backscattered/secondary-electron signal. Some of the techniques disclosed herein solve the problems associated with the weak backscattered/secondary-electron signal. In particular, when the wafer is scanned by an electron beam, the wafer not only may emit backscattered or secondary electrons, but also may release an electric current. The intensity of the released electric current may also vary based on the properties of the internal or external structures of the wafer, and thus indicate structural information of the wafer. The disclosed ebeam system collects and analyses the released electric current to determine the wafer structure information. As explained in more detail below, the intensity of the released electric current is high when the backscattered/secondary-electron signal is weak. Therefore, the disclosed ebeam system can detect wafer structures that the traditional ebeam systems have difficulty in detecting. Moreover, the present application also provides techniques for simultaneously collecting the backscattered/secondary-electron signal and released current signal, and comparing both signals to provide complementary information about the wafer structure, without increasing the amount of time for scanning the wafer. Therefore, the disclosed ebeam system can detect a wafer structure more accurately and efficiently.

As used throughout this application, unless specifically stated otherwise, the term "or" encompasses all possible combinations, except where infeasible. For example, if it is stated that a device can include A or B, then, unless specifically stated otherwise or infeasible, the device can include A, or B, or A and B. As a second example, if it is stated that a device can include A, B, or C, then, unless specifically stated otherwise or infeasible, the device can include A, or B, or C, or A and B, or A and C, or B and C, or A and B and C.

FIG. 1 illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer cassettes that contain wafers (e.g., semiconductor wafers or wafers made of other material(s)) or samples to be inspected (wafers and samples are collectively referred to as "wafers" hereafter).

One or more robot arms (not shown) in EFEM 106 transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104.

Figure 2:
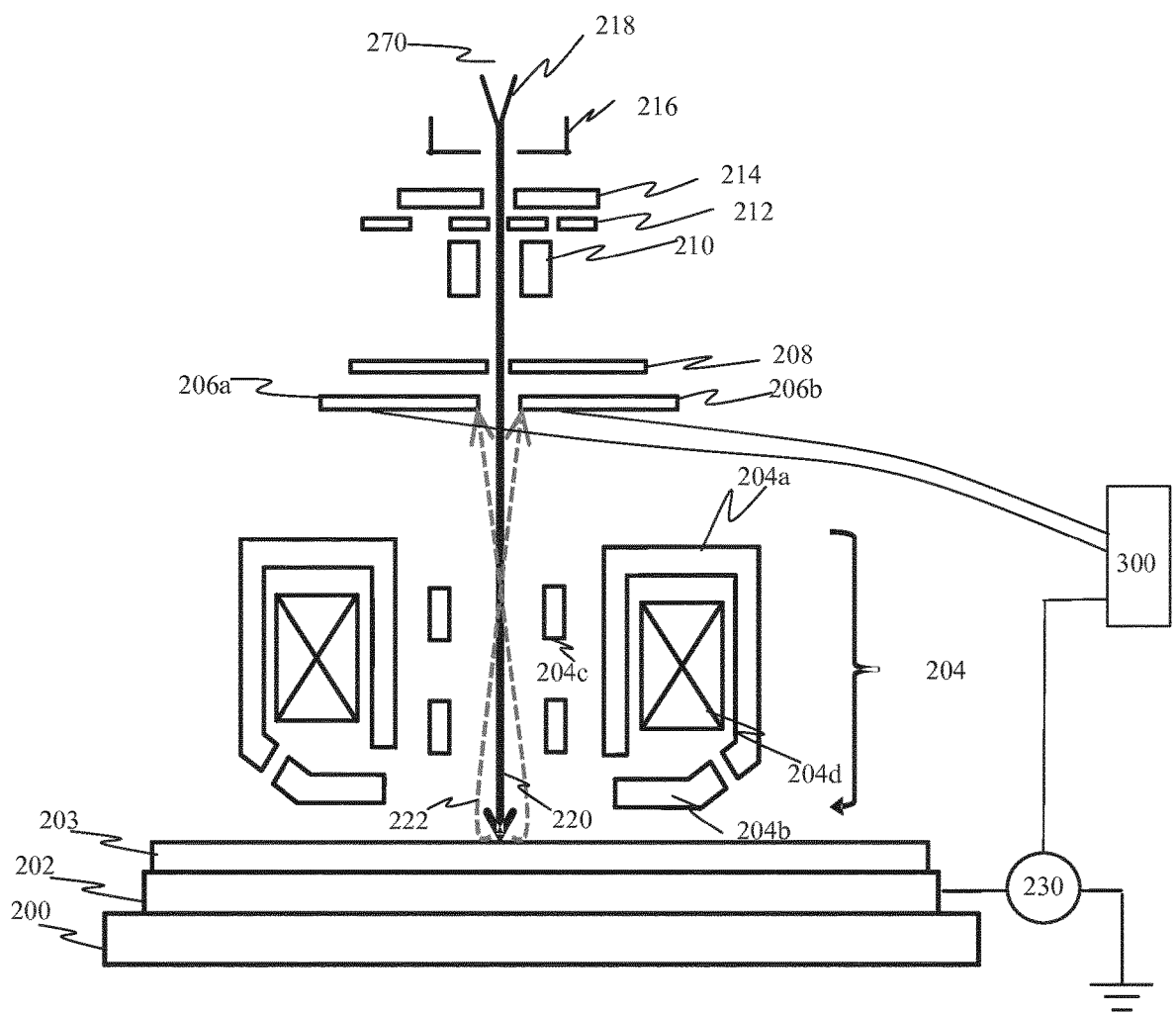
FIG. 2 is a schematic diagram illustrating an exemplary electron beam tool that may be a part of the exemplary electron beam inspection of FIG. 1, consistent with embodiments of the present disclosure.

FIG. 2 illustrates exemplary components of electron beam tool 104, consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in one embodiment, may include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a may generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary-electron/backscattered-electron (SE/BSE) beam 222 may be emitted from the part of wafer 203 upon receiving primary electron beam 220. Secondary electron beam 222 may form beam spot(s) on sensor surfaces 206a or 206b of electron detector 206. Electron detector 206 may generate a signal (e.g., a voltage, a current, etc.) that represents an intensity of the beam spot and may provide the signal to a controller 300 via a wired or wireless communication with electron detector 206. The intensity of SE/BSE beam 222, and the resultant beam spot(s), may vary according to the external or internal structure of wafer 203. Moreover, as discussed above, primary electron beam 220 may be projected onto different locations of the top surface of the wafer, or different sides of the wafer at a particular location, to generate SE/BSE beams 222 (and the resultant beam spot) of different intensities. Therefore, by mapping the intensities of the beam spots with the locations of wafer 203, controller 300 may reconstruct an SE/BSE image that reflects the internal or external structures of wafer 203.

As described above, an ebeam tool offers superior spatial resolution than an optical tool. However, the ebeam tool's sensitivity still depends on the devices or structures to be detected. For example, some structures, such as high-aspect-ratio (HAR) holes and trenches, may prevent the backscattered electrons or secondary electrons from escaping the wafer (e.g., wafer 203), thereby significantly reducing the amount of electrons reaching the detector (e.g., electron detector 206). This not only makes different HAR structures appear dark in the SEM image, but also causes the SEM's signal-to-noise ratio to deteriorate. For example, there may be no difference for normal and defective HAR holes in an SEM image.

As in-line metrologies used in the semiconductor industry are being challenged by the aggressive pace of device scaling and the adoption of novel device architectures, the sensitivity limitations may keep the ebeam tools from meeting the requirements posed by next-generation wafer inspection technologies. For example, many different applications, including logic contacts, trench isolations, and three-dimensional (3D) memory features, require inspection to monitor the lithographic processes in creating HAR structures. For these applications, holes and trenches of 20:1, 30:1, 40:1, or even 60:1 may need to be formed on a wafer. For example, HAR contact holes may be 1 μm in depth and 30 nm in diameter, for an aspect ratio of approximately 30:1 at the 32 nm node. However, as explained above, medium or low energy backscattered electrons (BSE) and secondary electrons (SE) may have difficulty in escaping from HAR structures. Therefore, the BSE and SE based measurement is less sensitive to HAR structures, and may miss important defect or critical-dimension information of HAR structures.

To solve these problems, electron beam tool 104 is further configured to obtain electron beam induced current (EBIC) of wafer 203, and determine the structural information of wafer 203 based on the EBIC signal, in addition to or in combination with the BSE/SE signal. Because some structural features (e.g., HAR structures) may have a higher EBIC signal intensity than BSE/SE signal intensity, the EBIC signal is more sensitive to these structural features. Therefore, electron beam tool 104's sensitivity is improved.

Figure 3:
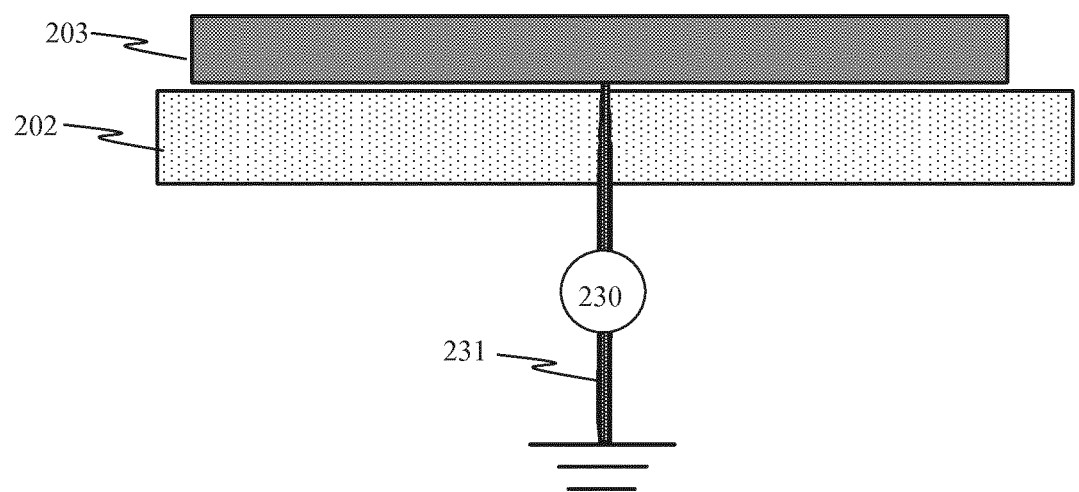
FIG. 3 is a schematic diagram illustrating a structural configuration for measuring EBIC, consistent with embodiments of the present disclosure.

Specifically, consistent with the disclosed embodiments, wafer 203 may be grounded via a wafer holder 202 and an EBIC detection circuit 230. As schematically shown in FIG. 3, in some embodiments, an electric wire 231 may be extended from wafer 203 and connected to the ground via sample holder 202. While primary beam 220 scans wafer 203, the EBIC (or substrate current) may pass through electric wire 231 and be measured by EBIC detection circuit 230.

Referring back to FIG. 2, EBIC detection circuit 230 is in a wired or wireless communication with controller 300 and reports the measured EBIC value to controller 300. As such, while primary electron beam 220 scans wafer 203, the SE/BSE and EBIC signals may be simultaneously measured and transmitted to controller 300. Controller 300 may correlate the SE/BSE data and EBIC data that correspond to the same locations (or features) of wafer 203. Controller 300 may also construct an SE/BSE image and an EBIC image, respectively. For example, the SE/BSE image and EBIC image may be grayscale images whose grayscale levels are proportional to the intensities of the SE/BSE and EBIC signals. Controller 300 may further compare the SE/BSE data (or image) with the EBIC data (or image). Based on the comparison, controller 300 may determine structural information (e.g., defects, critical dimensions, edges, etc.) of wafer 203 that are not easy to be detected based on the SE/BSE data (or image) alone.

Figure 4:
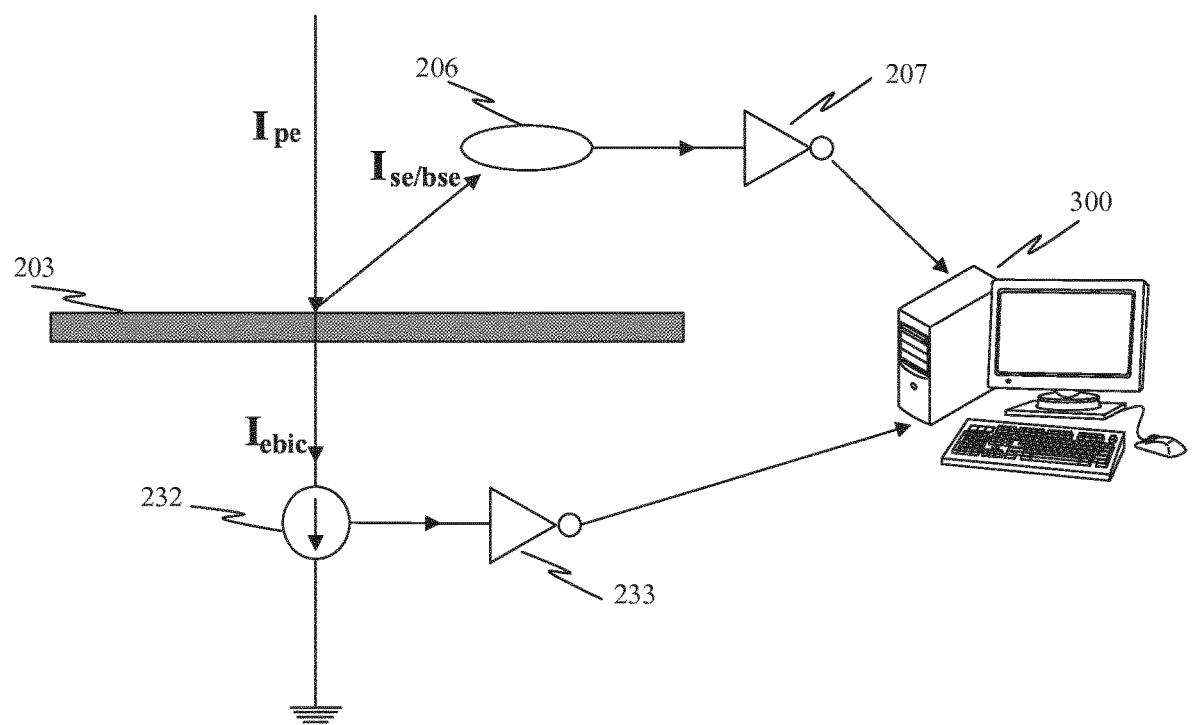
FIG. 4 is a schematic diagram illustrating coupling of SE/BSE measurement with EBIC measurement, consistent with embodiments of the present disclosure.

FIG. 4 is a schematic diagram illustrating the coupling of SE/BSE measurement and EBIC measurement, consistent with embodiments of the present disclosure. Referring to FIG. 4, the beam current of primary electron beam 220, $I_{pe}$, may be measured by projecting primary electron beam 220 into a faraday cup (not shown). When primary electron beam 220 is projected on surface of wafer 203, SE/BSE may be generated and collected by electron detector 206. The current of the SE/BSE, $I_{se/bse}$, is measured by electron detector 206 and amplified by amplifier 207. The amplified $I_{se/bse}$ signal is then transmitted to controller 300. Meanwhile, EBIC is generated in the form of substrate current and flows to the ground. EBIC detection circuit 230 includes an ammeter 232 (e.g., pico meter) for measuring the EBIC, $I_{ebic}$, and an amplifier 233 for amplifying the $I_{ebic}$ signal. The amplified $I_{ebic}$ signal is then transmitted to controller 300. The $I_{se/bse}$ signal and $I_{ebic}$ signal may be used to contract the SE/BSE image and EBIC images of wafer 203, respectively. Because $I_{pe}=I_{se/bse}+I_{ebic}$, when $I_{se/bse}$ is weaker due to certain features (e.g., materials, HAR structures, etc.) of wafer 203, $I_{ebic}$ may be strong enough and may be relied upon to determine the structure information of wafer 203.

For example, the yield of SE/BSE emission may depend on the types of materials coated on wafer 203.

Table 1 below shows the yield of SE/BSE emission

| | 2.43 nA | | | 4.9 nA | | |
|---|---|---|---|---|---|---|
| $I_{pe}$ | $I_{ebic}$ | $I_{se/bse}$ | SE/BSE Yield | $I_{ebic}$ | $I_{se/bse}$ | SE/BSE Yield |
| Titanium (Ti) | 2.4 nA | 0.03 nA | 0.01 | 4.8 nA | 0.1 nA | 0.02 |
| Gold (Au) | 1.96 nA | 0.47 nA | 0.19 | 3.88 nA | 1.02 nA | 0.21 |

Referring to Table 1, $I_{pe}$ and $I_{ebic}$ may be measured by the faraday cup and ammeter 232, respectively. $I_{se/bse}$ may be calculated based on $I_{se/bse}=I_{pe}-I_{ebic}$ and the yield of SE/BSE emission may be calculated based on Yield=$I_{se/bse}/I_{pe}$. As Table 1 indicates, heavy metals such as gold has relatively high yield of SE/BSE emission, while transition medals such as titanium has relatively low yield of SE/BSE emission. In the disclosed embodiments, when the wafer 203's yield of SE/BSE emission is low, its $I_{ebic}$ signal is strong and may be used to determine structural information of wafer 203.

Figure 5:
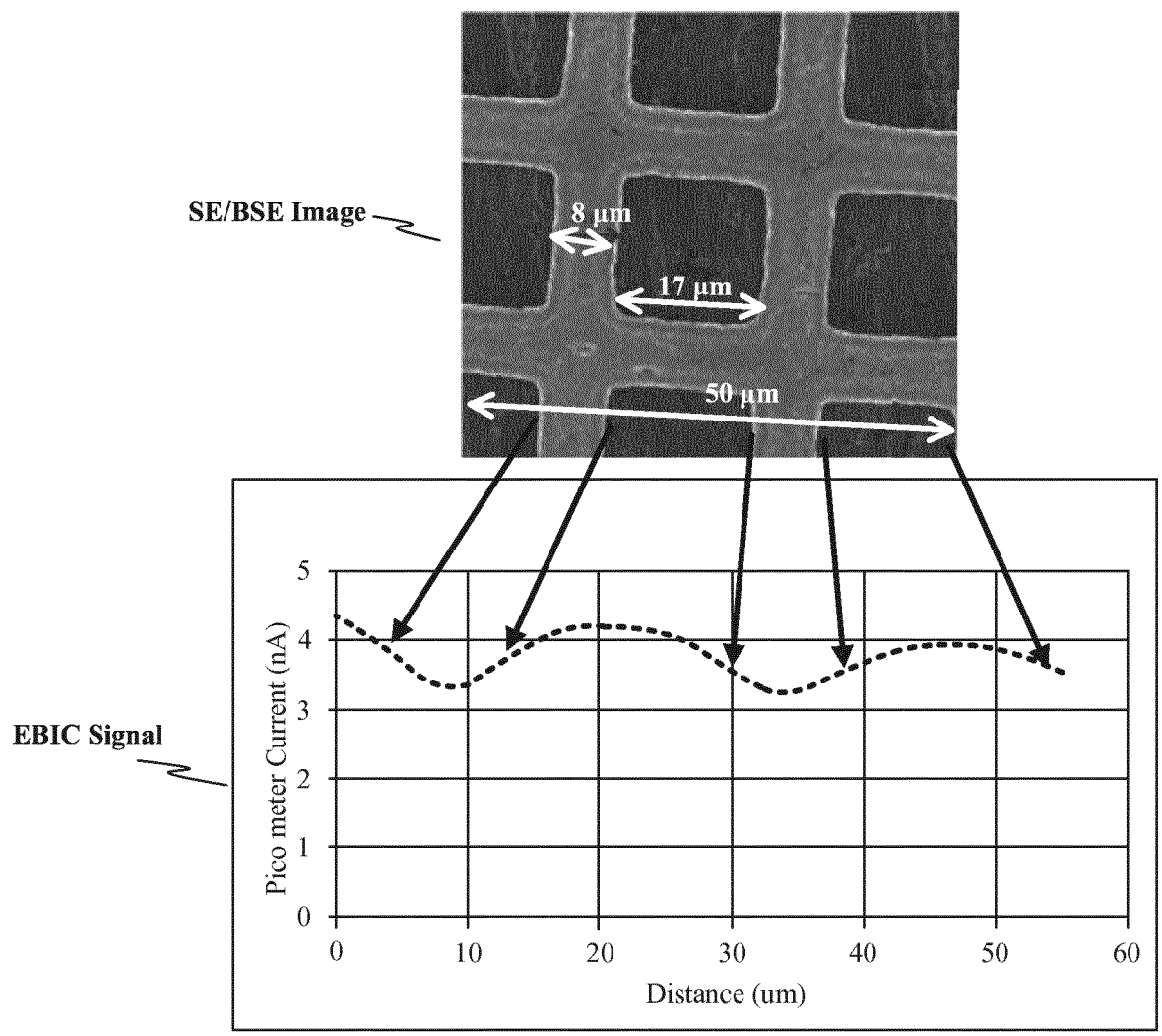
FIG. 5 is a schematic diagram illustrating correlation between a wafer's SE/BSE signal and EBIC signal, consistent with embodiments of the present disclosure.

FIG. 5 is a schematic diagram illustrating correlation between SE/BSE signal and EBIC signal that are generated by the same wafer, consistent with embodiments of the present disclosure. Referring to FIG. 5, while primary electron beam 220 scans wafer 203, the SE/BSE signal and EBIC signal generated by wafer 203 may be synchronized. Depending on the speeds (i.e., frequencies) of ammeter 232 and electron detector 206, the resolution of EBIC signal may be the same as or different from the resolution of the SE/BSE image. In the example shown in FIG. 5, the SE/BSE image of wafer 203 has a resolution of 2 nm, while the EBIC signal has a resolution of 1 µm, because ammeter 232 has a lower speed than that of electron detector 206. As such, to compare the synchronized SE/BSE signal and EBIC signal, the pixels of the SE/BSE image may be first averaged over 1 µm and then compared with the EBIC signal.

As illustrated by FIG. 5, in the SE/BSE image, the pixels with high grayscale values (i.e., "bright") correspond to a lower $I_{ebic}$, and the pixels with low grayscale values (i.e., "dark") correspond to a higher $I_{ebic}$. The line features on wafer 203 may be detected based on the EBIC signal, SE/BSE signal, or a combination thereof.

Figure 6:
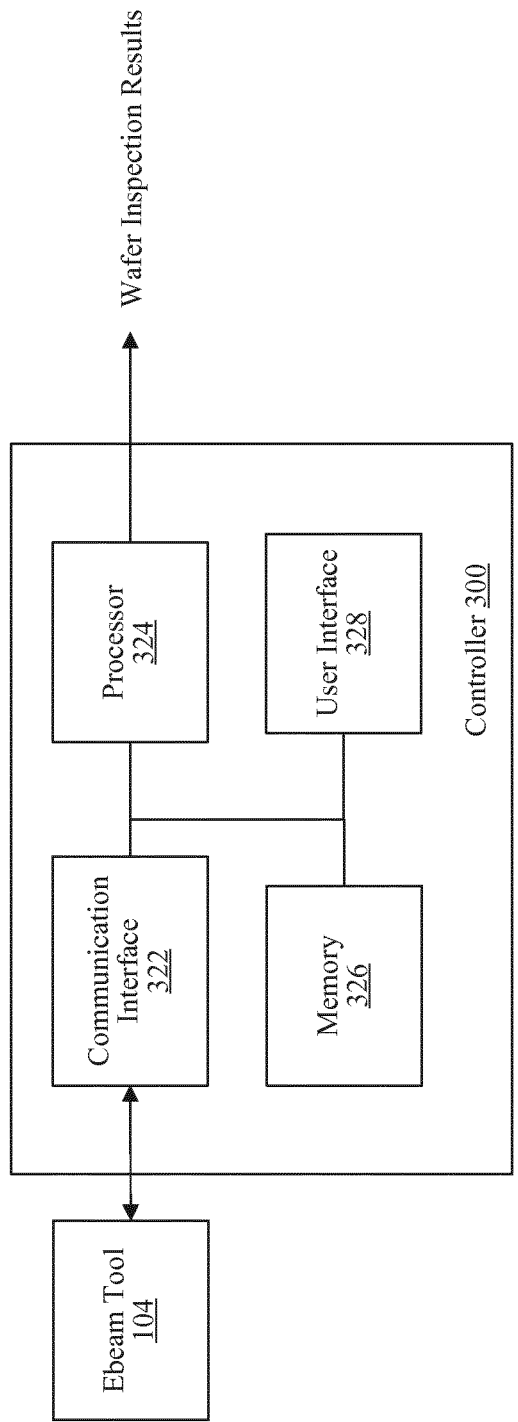
FIG. 6 is a block diagram of an exemplary controller in communication with the electron beam inspection of FIG. 2, consistent with embodiments of the present disclosure.

FIG. 6 is a block diagram of an exemplary controller 300, consistent with exemplary embodiments of the present disclosure. Controller 300 is electronically connected to ebeam tool 104. Controller 300 may be a computer configured to execute various controls of EBI system 100. For example, controller 300 may control various components of ebeam tool 104 to scan primary electron beam 220 over the surface of wafer 203, such that wafer 203 may emit the SE/BSE and EBIC, which may be simultaneously detected by ebeam tool 104.

Referring to FIG. 6, controller 300 has a communication interface 322 that is electrically coupled to ebeam tool 104 to receive the SE/BSE data and EBIC data regarding a wafer. Controller 300 also includes a processor 324 that is configured to synchronize the SE/BSE data and EBIC data, construct an SE/BSE image and an EBIC image of the wafer, compare the SE/BSE data/image with the EBIC data/image, and determine structural information of the wafer based on the comparison.

Processor 324 may include one or more of a central processing unit (CPU), an image processing unit, an application-specific integrated circuit (ASIC), a field-programmable gate array (FPGA), etc. In some embodiments, processor 324 may be one or more processing devices designed to perform functions of the disclosed wafer inspection methods, such as a single core or multiple core processors capable of executing parallel processes simultaneously. For example, processor 324 may be a single core processor configured with virtual processing technologies. In certain embodiments, processor 324 may use logical processors to simultaneously execute and control multiple processes. Processor 324 may implement virtual machine technologies, or other known technologies to provide the ability to execute, control, run, manipulate, store, etc. multiple software processes, applications, programs, etc. In some embodiments, processor 324 may include a multiple-core processor arrangement (e.g., dual core, quad core, etc.) configured to provide parallel processing functionalities to execute multiple processes simultaneously. It is appreciated that other types of processor arrangements could be implemented that provide for the capabilities disclosed herein.

Controller 300 may also include memory 326 that includes instructions to enable processor 324 to execute one or more applications, such as the disclosed wafer inspection processes, and any other type of application or software known to be available on computer systems. Alternatively or additionally, the instructions, application programs, etc. may be stored in an internal database or an external storage (not shown) in direct communication with controller 300. The internal database or external storage may be a volatile or non-volatile, magnetic, semiconductor, tape, optical, removable, non-removable, or other type of storage device or tangible or non-transitory computer-readable medium, or can be cloud storage. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Consistent with the disclosed embodiments, memory 326 may include instructions that, when executed by processor 324, perform one or more processes consistent with the functionalities disclosed herein. Moreover, processor 324 may execute one or more programs located remotely from controller 300. For example, controller 300 may access one or more remote programs, that, when executed, perform functions related to disclosed embodiments.

Controller 300 may also include a user interface 328. User interface 328 may include a display, such as a cathode ray tube (CRT), a liquid crystal display (LCD), or a touch screen, for displaying information to a computer user. For example, the display may be used to present the wafer inspection result (e.g., defect information, dimension information, etc.) to a user. Interface 328 may also include an input device, including alphanumeric and other keys, for communicating information and command selections to processor 324. Another type of user input device is a cursor control, such as a mouse, a trackball, or cursor direction keys for communicating direction information and command selections to processor 328 and for controlling cursor movement on the display. The input device typically has two degrees of freedom in two axes, a first axis (for example, x) and a second axis (for example, y), that allows the device to specify positions in a plane. In some embodiments, the same direction information and command selections as cursor control may be implemented via receiving touches on a touch screen without a cursor. For example, a user may use the input device to select an inspection area of a wafer or enter the defect properties to be examined.

In some embodiments, user interface 328 may be configured to implement a graphical user interface (GUI) that may be stored in a mass storage device as executable software codes that are executed by the one or more computing devices. This and other modules may include, by way of example, components, such as software components, object-oriented software components, class components and task components, processes, functions, fields, procedures, subroutines, segments of program code, drivers, firmware, microcode, circuitry, data, databases, data structures, tables, arrays, and variables.

Figure 7:
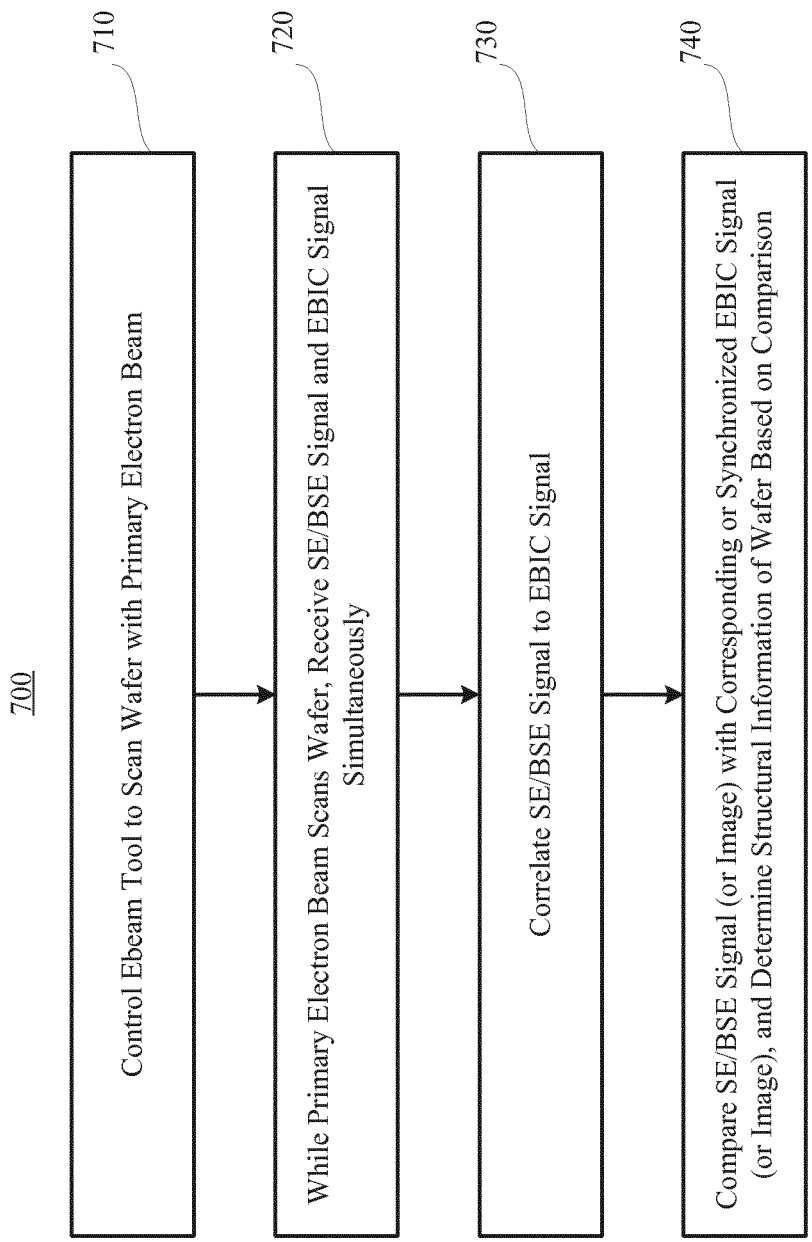
FIG. 7 is a flowchart of a wafer inspection method, consistent with embodiments of the present disclosure.

FIG. 7 is a flowchart of a wafer inspection method 700, consistent with embodiments of the present disclosure. Method 700 may be performed by a controller (e.g., controller 300) that is in communication with an ebeam tool (e.g., ebeam tool 104). Referring to FIG. 7, method 700 may include one or more of the following steps 710-740.

In step 710, the controller controls the ebeam tool to scan a wafer (e.g., wafer 203) with a primary electron beam (e.g., primary electron beam 220). The scanning operation may be performed by deflecting the primary electron beam over the wafer surface, moving the wafer under the primary electron beam, or a combination thereof.

In step 720, while the primary electron beam scans the wafer, the controller receives an SE/BSE signal and an EBIC signal substantially simultaneously. Both the SE/BSE signal and EBIC signal result from the scanning. The ebeam tool may include an electron detector (e.g., electron detector 206) for collecting the SE/BSE and generating an SE/BSE signal having an intensity that is proportional to the SE/BSE current. The ebeam tool may also include an ammeter (e.g., electron detector 232) for measuring the EBIC. Both the SE/BSE signal and EBIC signal are amplified and then transmitted to the controller.

In step 730, the controller correlates the SE/BSE signal to the EBIC signal. The controller may correlate each data point of the SE/BSE signal and the EBIC signal to the corresponding scanning position. Alternatively or additionally, the controller may synchronize the SE/BSE signal with the EBIC signal in time. Optionally, the controller may construct an SE/BSE image or an EBIC image of the wafer based on the SE/BSE signal and EBIC signal, respectively.

In step 740, the controller determines structural information of the wafer based on at least one of the SE/BSE signal and the EBIC signal. In some embodiments, the controller may compare the SE/BSE signal originating from different dies or cells of a wafer, and detect defects based on the comparison. For example, the controller may determine whether the SE/BSE images of different dies or cells have any discrepancies. If there is a discrepancy, the controller may further review the SE/BSE images to determine whether the discrepancy corresponds to a defect. Similarly, in some embodiments, the controller may also compare the EBIC signal originating from different dies or cells of a wafer and detect defects based on the comparison.

In some embodiments, the controller may compare the SE/BSE signal (or image) with the corresponding or synchronized EBIC signal (or image), and determine structural information of the wafer based on the comparison. For example, the controller may detect a defect based on the comparison. For example, for a structure or device (e.g., HAR structure or device) that has low SE/BSE intensity but high EBIC intensity (i.e., the SE/BSE emission is lower than a predetermined threshold), the EBIC signal may be used to detect the defect because the EBIC signal has a higher signal-to-noise ratio. For another example, the sum of the SE/BSE intensity and the EBIC intensity is generally equal to the intensity of the primary electron beam, which is a constant. If, however, the sum of the SE/BSE intensity and the EBIC intensity fluctuates drastically at certain regions of the wafer, this phenomenon may suggest that the affected region contains a defect.

The above-described system and method inspect a wafer based on both SE/BSE imaging of the wafer and EBIC imaging of wafer. In particular, when the disclosed ebeam system scans a wafer and detects SEs and BSEs originating from the wafer, an additional data channel is created to simultaneously collect EBIC (or substrate current) of the wafer. The EBIC data may be correlated to (e.g., synchronized with) the SE/BSE data, and used to supplement or substitute the SE/BSE data when the SE/BSE based measurement has low density to the inspected structures.

Because the EBIC data may be obtained and analyzed at the same time as the SE/BSE data, while the wafer is scanned by an electron beam, the disclosed system and method may be fully integrated into the in-line metrology. Moreover, because the disclosed embodiments provide higher sensitivity, additional post-production processes/steps to examine HAR structures may be avoided. Therefore, the productivity of IC manufacturing is improved.

The embodiments may further be described using the following clauses:

1. An electron beam system comprising:
   an electron detector that includes circuitry to detect secondary electrons or backscattered electrons (SE/BSE) emitted from a wafer;
   a current detector that includes circuitry to detect an electron-beam-induced current (EBIC) from the wafer; and
   a controller having one or more processors and a memory, the controller including circuitry to:
   acquire data regarding the SE/BSE;
   acquire data regarding the EBIC; and
   determine structural information of the wafer based on an evaluation of the SE/BSE data and the EBIC data.

2. The electron beam system of clause 1, wherein in the determination of the structural information, the controller includes circuitry to:
   synchronize the SE/BSE data and the EBIC data.

3. The electron beam system of any one of clauses 1 and 2, wherein in the determination of the structural information, the controller includes circuitry to:
   compare the SE/BSE data with the EBIC data; and
   determine the structural information based on the comparison.

4. The electron beam system of clause 3, wherein in comparing the SE/BSE data to the EBIC data, the controller includes circuitry to:
   construct an SE/BSE image of the wafer based on the SE/BSE data;
   construct an EBIC image of the wafer based on the EBIC data; and
   compare the SE/BSE image to the EBIC image.

5. The electron beam system of any one of clauses 1 to 4, wherein the structural information includes at least one of:
   a defect on the wafer;
   a critical dimension of a feature formed on the wafer; and
   an edge of a feature formed on the wafer.

6. The electron beam system of any one of clauses 1 to 5, wherein the current detector circuitry is coupled to the wafer, the current detector circuitry being configured to receive electric current from the wafer and provide EBIC data to the controller.

7. The electron beam system of clause 6, wherein the current detector circuitry coupled to the wafer includes an ammeter configured to measure an intensity of the EBIC and output the intensity as the EBIC data.

8. The electron beam system of any one of clauses 6 and 7, the current detector circuitry coupled to the wafer includes an amplifier configured to amplify the EBIC data.

9. The electron beam system of any one of clauses 1 to 8, wherein the electron detector includes circuitry to provide SE/BSE data based on intensity of the SE/BSE to the controller.

10. The electron beam system of any one of clauses 1 to 9, wherein the EBIC is substrate current of the wafer.

11. The electron beam system of any one of clauses 1 to 10, further comprising an electron beam tool that includes circuitry to scan the wafer with a primary electron beam.

12. A computer system comprising:
a memory storing instructions; and
a processor electronically coupled to the memory and configured to execute the instructions to cause the computer system to:
acquire data regarding secondary electrons or backscattered electrons (SE/BSE) emitted from a wafer;
acquire data regarding an electron-beam-induced current (EBIC) from the wafer;
evaluate the SE/BSE data and the EBIC data; and
determine structural information of the wafer based on the evaluation of the SE/BSE data and the EBIC data.

13. The computer system of clause 12, wherein in the determination of the structural information, the processor is further configured to execute the instructions to cause the computer system to:
compare the SE/BSE data with the EBIC data; and
determine the structural information based on the comparison.

14. The computer system of clause 13, wherein in comparing the SE/BSE data with the EBIC data, the processor is further configured to execute the instructions to cause the computer system to:
construct an SE/BSE image of the wafer based on the SE/BSE data;
construct an EBIC image of the wafer based on the EBIC data; and
compare the SE/BSE image with the EBIC image.

15. The computer system of any one of clauses 12 to 14, wherein the structural information includes at least one of:
a defect on the wafer;
a critical dimension of a feature formed on the wafer; and
an edge of a feature formed on the wafer.

16. The computer system of any one of clauses 12 to 15, wherein the EBIC is substrate current of the wafer.

17. A method comprising:
acquiring data regarding secondary electrons or backscattered electrons (SE/BSE) emitted from a wafer scanned with an electron beam;
acquiring data regarding an electron-beam-induced current (EBIC) from the wafer; and
determining structural information of the wafer based on an evaluation of the SE/BSE data and the EBIC data.

18. The method of clause 17, further comprising:
synchronizing the SE/BSE data with the EBIC data.

19. The method of any one of clauses 17 and 18, wherein determining the structural information of the wafer comprises:
comparing the SE/BSE data with the EBIC data; and
determining the structural information based on the comparison.

20. The method of clause 19, wherein comparing the SE/BSE data and the EBIC data further comprises:
constructing an SE/BSE image of the wafer based on the SE/BSE data;
constructing an EBIC image of the wafer based on the EBIC data; and
comparing the SE/BSE image to the EBIC image.

21. The method of any one of clauses 17 to 20, further comprising: receiving substrate current of the wafer and convert the substrate current into the EBIC data.

22. The method of clause 21, further comprising:
measuring an intensity of the substrate current and outputting the intensity as the EBIC data.

23. The method of any one of clauses 21 and 22, further comprising:
amplifying the EBIC data.

24. A non-transitory computer-readable medium storing a set of instructions that is executable by one or more processors of one or more devices to cause the one or more devices to perform a method comprising:
acquiring data regarding secondary electrons or backscattered electrons (SE/BSE) emitted from a wafer;
acquiring data regarding an electron-beam-induced current (EBIC) from the wafer; and
determining structural information of the wafer based on an evaluation of the SE/BSE data and the EBIC data.

25. The non-transitory computer-readable medium of clause 24, wherein the set of instructions is executable by the one or more processors of one or more devices to cause the one or more devices to further perform:
controlling an electron beam tool to scan the wafer using a primary electron beam.

26. The non-transitory computer-readable medium of any one of clauses 24 and 25, wherein the set of instructions is executable by the one or more processors of one or more devices to cause the one or more devices to further perform:
synchronizing the SE/BSE data with the EBIC data.

27. The non-transitory computer-readable medium of any one of clauses 24 to 26, wherein the set of instructions is executable by the one or more processors of one or more devices to cause the one or more devices to further perform:
comparing the SE/BSE data with the EBIC data; and
determining the structural information based on the comparison.

28. The non-transitory computer-readable medium of clause 27, wherein the set of instructions is executable by the one or more processors of one or more devices to cause the one or more devices to further perform:
constructing an SE/BSE image of the wafer based on the SE/BSE data;
constructing an EBIC image of the wafer based on the EBIC data; and
comparing the SE/BSE image to the EBIC image.

29. The non-transitory computer-readable medium of any one of clauses 24 to 28, wherein the EBIC is substrate current of the wafer.

It will be appreciated that the disclosed embodiments are not limited to the exact construction that has been described above and illustrated in the accompanying drawings, and that various modifications and changes may be made without departing from the scope thereof. It is intended that the scope of the subject matter should only be limited by the appended claims.

What is claimed is:
1. An electron beam system comprising:
an electron detector configured to detect secondary electrons or backscattered electrons (SE/BSE) emitted from a wafer;
a current detector configured to detect an electron-beam-induced current (EBIC) from the wafer; and a controller having one or more processors and a memory storing instructions, the one or more processors being configured to execute the instructions to cause the controller to:
  acquire data regarding the SE/BSE;
  acquire data regarding the EBIC; and
  determine structural information of the wafer based on a comparison of the SE/BSE data and the EBIC data.

2. The electron beam system of claim 1, wherein in the determination of the structural information, the one or more processors are configured to execute the instructions to cause the controller to:
  synchronize the SE/BSE data and the EBIC data.

3. The electron beam system of claim 1, wherein in comparing the SE/BSE data to the EBIC data, the one or more processors are configured to execute the instructions to cause the controller to:
  construct an SE/BSE image of the wafer based on the SE/BSE data;
  construct an EBIC image of the wafer based on the EBIC data; and
  compare the SE/BSE image to the EBIC image.

4. The electron beam system of claim 1, wherein the structural information includes at least one of:
  a defect on the wafer;
  a critical dimension of a feature formed on the wafer; or
  an edge of a feature formed on the wafer.

5. The electron beam system of claim 1, wherein the current detector is coupled to the wafer, the current detector being configured to receive electric current from the wafer and provide EBIC data to the controller.

6. The electron beam system of claim 5, wherein the current detector coupled to the wafer includes an ammeter configured to measure an intensity of the EBIC and output the intensity as the EBIC data.

7. The electron beam system of claim 5, the current detector coupled to the wafer includes an amplifier configured to amplify the EBIC data.

8. The electron beam system of claim 1, wherein the electron detector is configured to provide SE/BSE data based on intensity of the SE/BSE to the controller.

9. The electron beam system of claim 1, wherein the current detector is coupled to a substrate of the wafer, the current detector being configured to receive electric current from the substrate.

10. The electron beam system of claim 1, further comprising an electron beam tool configured to scan the wafer with a primary electron beam.

11. The electron beam system of claim 1, wherein in the determination of the structural information, the one or more processors are configured to execute the instructions to cause the controller to detect a defect on the wafer based on at least:
  a sum of an SE/BSE intensity and an EBIC intensity, or
  a difference between the SE/BSE intensity and the EBIC intensity.

12. The electron beam system of claim 11, wherein the one or more processors are configured to execute the instructions to cause the controller to:
  detect a defect on the wafer based on a fluctuation of the sum of the SE/BSE intensity and the EBIC intensity.

13. The electron beam system of claim 11, wherein the one or more processors are configured to execute the instructions to cause the controller to:
  in response to the EBIC intensity being higher than the SE/BSE intensity, detect a defect on the wafer based on the EBIC data.

14. A method comprising:
  acquiring data regarding secondary electrons or backscattered electrons (SE/BSE) emitted from a wafer scanned with an electron beam;
  acquiring data regarding an electron-beam-induced current (EBIC) from the wafer; and
  determining structural information of the wafer based on a comparison of the SE/BSE data and the EBIC data.

15. The method of claim 14, further comprising:
  synchronizing the SE/BSE data with the EBIC data.

16. The method of claim 3, wherein comparing the SE/BSE data and the EBIC data further comprises:
  constructing an SE/BSE image of the wafer based on the SE/BSE data;
  constructing an EBIC image of the wafer based on the EBIC data; and
  comparing the SE/BSE image to the EBIC image.

* * * * *